(12) United States Patent
Lee et al.

(10) Patent No.: US 12,706,147 B2
(45) Date of Patent: Aug. 11, 2026

(54) MEMORY DEVICE RELATED TO PERFORMING A READ OPERATION AND METHOD OF OPERATING THE MEMORY DEVICE

(71) Applicant: SK hynix Inc., Icheon-si (KR)

(72) Inventors: Hyun Soo Lee, Icheon-si (KR); Kyu Tae Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 238 days.

(21) Appl. No.: 18/514,642

(22) Filed: Nov. 20, 2023

(65) Prior Publication Data

US 2024/0404599 A1 Dec. 5, 2024

(30) Foreign Application Priority Data

Jun. 5, 2023 (KR) ........................ 10-2023-0072120

(51) Int. Cl.
*G11C 16/08* (2006.01)
*G11C 16/26* (2006.01)
*G11C 16/30* (2006.01)

(52) U.S. Cl.
CPC .............. *G11C 16/08* (2013.01); *G11C 16/26* (2013.01); *G11C 16/30* (2013.01)

(58) Field of Classification Search
CPC ....... G11C 7/1051; G11C 7/22; G11C 7/1071; G11C 7/1066; G11C 7/1006
USPC .................................................... 365/189.15
See application file for complete search history.

(56) References Cited

U.S. PATENT DOCUMENTS

2012/0218817 A1* 8/2012 Kang ..................... G11C 16/30 365/185.18
2022/0180929 A1* 6/2022 Xiang .................... G11C 5/145
2023/0018305 A1* 1/2023 Kim ................... G11C 16/3459
2024/0420794 A1* 12/2024 Kim ..................... G11C 29/021

FOREIGN PATENT DOCUMENTS

KR 102273185 B1 7/2021
KR 1020220056909 A 5/2022

* cited by examiner

*Primary Examiner* — Jerome Leboeuf
(74) *Attorney, Agent, or Firm* — WILLIAM PARK AND ASSOCIATES LTD.

(57) ABSTRACT

The present technology relates to a semiconductor device. In an embodiment, a memory device capable of reducing a time required for a read operation and preventing an HCI phenomenon of a memory cell may include a plurality of voltage regulators configured to generate operation voltages applied to a word line group, a switch control signal generator configured to generate at least one switch control signal controlling to connect or disconnect at least one voltage regulator among the plurality of voltage regulators to or from the word line group, and a plurality of switching circuits each is connected to any one voltage regulator among the plurality of voltage regulators, and connecting the plurality of voltage regulator to the word line group according to the switch control signal in a period in which a pass voltage among the operation voltages is applied to the word line group during a read operation.

11 Claims, 9 Drawing Sheets

100
110
BLKz
BLK1
PG
ST
DST
MCm
MC2
MC1
SST
DSL
WLm
WL2
WL1
SSL
CSL
BL1
BL2
BLn
140
INPUT/OUTPUT CIRCUIT
DATA
RL
130
ADDRESS DECODER
131
SWITCH CONTROL SIGNAL GENERATOR
SW_GR1
SW_GR2
SW_GRn
ADDR, SEL
150
CONTROL LOGIC
151
READ OPERATION CONTROLLER
CMD
ADDR
Vop
120
VOLTAGE GENERATOR
FIRST VOLTAGE REGULATOR
SECOND VOLTAGE REGULATOR
n-TH VOLTAGE REGULATOR
OPSIG
121-1
121-2
121-n

FIG. 4

MEMORY DEVICE RELATED TO PERFORMING A READ OPERATION AND METHOD OF OPERATING THE MEMORY DEVICE

CROSS-REFERENCE TO RELATED APPLICATION

The present application claims priority under 35 U.S.C. § 119(a) to Korean patent application number 10-2023-0072120 filed on Jun. 5, 2023, in the Korean Intellectual Property Office, the entire disclosure of which is incorporated by reference herein.

BACKGROUND

1. Technical Field

The present disclosure generally relates to a semiconductor device, and more particularly, to a read operation of a memory device.

2. Related Art

A memory device may be a device for storing data, and may be classified into a volatile memory device and a nonvolatile memory device.

A memory device may perform a read operation of reading data stored in a memory cell. During the read operation, the memory device may apply a pass voltage to a plurality of word lines connected to a plurality of memory cells and then apply a read voltage to a selected word line connected to selected memory cells.

Meanwhile, the plurality of word lines may be divided into a plurality of word line groups. In this case, the memory device may control a level of the pass voltage applied to each word line group.

SUMMARY

According to an embodiment of the present disclosure, a memory device may include a plurality of voltage regulators configured to generate operation voltages applied to a word line group, a switch control signal generator configured to generate at least one switch control signal controlling to connect or disconnect at least one voltage regulator among the plurality of voltage regulators to or from the word line group, and a plurality of switching circuits each is connected to any one voltage regulator among the plurality of voltage regulators, and connecting the plurality of voltage regulator to the word line group according to the switch control signal in a period in which a pass voltage among the operation voltages is applied to the word line group during a read operation.

According to an embodiment of the present disclosure, a memory device may include a first voltage regulator configured to generate operation voltages applied to a first word line group, a second voltage regulator configured to generate the operation voltages applied to a second word line group, a first switching circuit group connected to the first word line group, the first voltage regulator, and the second voltage regulator, a second switching circuit group connected to the second word line group, the first voltage regulator, and the second voltage regulator, and a switch control signal generator configured to generate a switch control signal controlling the first switching circuit group and the second switching circuit group to apply a first pass voltage generated by the first voltage regulator and the second voltage regulator to the first word line group and the second word line group, in a period in which a pass voltage among the operation voltages is applied to the first word line group and the second word line group.

BRIEF DESCRIPTION OF THE DRAWINGS

FIG. 4 is a diagram illustrating an operation of a switch control signal generator according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a memory device and a method of operating the memory device capable of reducing a time required for a read operation and preventing or mitigating a hot carrier injection (HCI) phenomenon of a memory cell.

According to an embodiment of the present technology, a memory device and a method of operating the same capable of reducing a time required for a read operation and preventing or mitigating an HCI phenomenon of a memory cell are provided.

Figure 1:
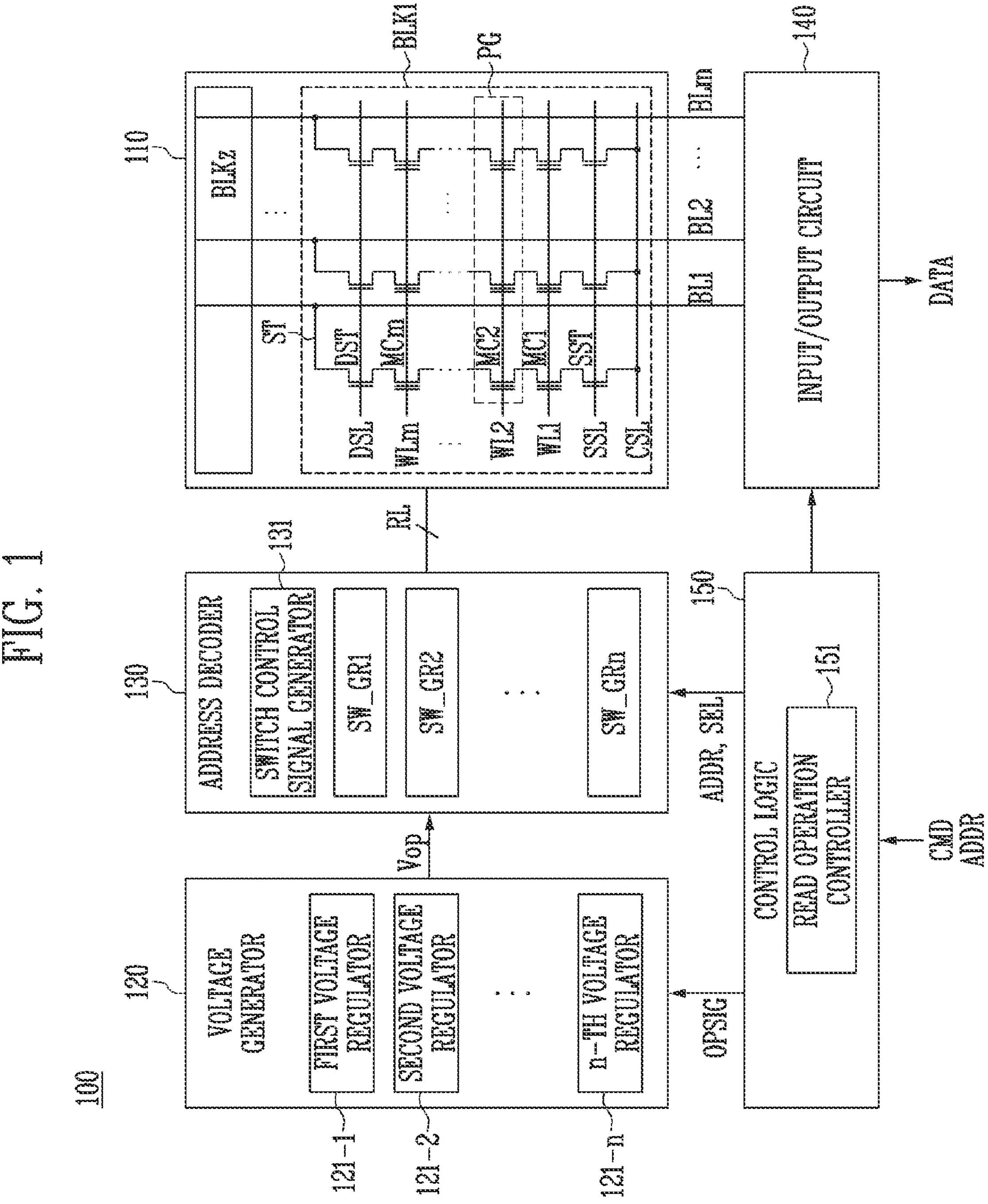
FIG. 1 is a diagram illustrating a memory device according to an embodiment of the present disclosure.

FIG. 1 is a diagram illustrating a memory device according to an embodiment of the present disclosure.

Referring to FIG. 1, the memory device 100 may include a memory cell array 110, a voltage generator 120, an address decoder 130, an input/output circuit 140, and control logic 150. The control logic 150 may be implemented as hardware, software, or a combination of hardware and software. For example, the control logic 150 may be a control logic circuit operating in accordance with an algorithm and/or a processor executing control logic code.

The memory cell array 110 includes a plurality of memory blocks BLK1 to BLKz.

The plurality of memory blocks BLK1 to BLKz may be connected to the address decoder 130 through row lines RL. The memory cell array 110 may be connected to the input/output circuit 140 through column lines. In an embodiment, the row lines RL may include word lines WL1 to WLm, source select lines SSL, and drain select lines DSL. In an embodiment, the column lines may include bit lines BL1 to BLm.

In an embodiment, the plurality of word lines WL1 to WLm may be divided into a plurality of word line groups. At this time, the number of word lines included in each word line group may be equal to or different from each other.

The plurality of memory blocks BLK1 to BLKz may include a plurality of strings ST connected between the bit lines BL1 to BLm and a source line SL. The bit lines BL1 to BLm may be connected to the strings ST, respectively, and the source line SL may be commonly connected to the strings ST.

The plurality of memory blocks BLK1 to BLKz may include a plurality of memory cells MC1 to MCm storing data. Among the plurality of memory cells, memory cells connected to the same word line may be defined as one physical page PG.

In an embodiment, the voltage generator 120, the address decoder 130, and the input/output circuit 140 may be collectively referred to as a peripheral circuit. The peripheral circuit may drive the memory cell array 110 under control of the control logic 150. The peripheral circuit may drive the memory cell arrays 110 to perform a write operation, a read operation, and an erase operation.

The voltage generator 120 may be configured to generate various voltages required by the memory device 100 using an external power voltage or an internal power voltage. For example, the voltage generator 120 may generate a plurality of erase voltages, a plurality of program voltages, a plurality of pass voltages, a plurality of read voltages, and the like in response to an operation signal OPSIG. Generated operation voltages Vop may be supplied to the memory cell array 110 by the address decoder 130.

In an embodiment, the voltage generator 120 may include a plurality of voltage regulators 121-1 to **121-*n***.

The plurality of voltage regulators 121-1 to **121-*n*** may generate the operation voltages Vop and apply the operation voltages Vop to the plurality of word lines WL1 to WLm.

The address decoder 130 may receive an address ADDR from the control logic 150. The address decoder 130 may decode a row address of the received address ADDR. The address decoder 130 may select at least one word line among the word lines WL1 to WLm of the memory cell array 110 according to a decoded row address. In an embodiment, the address decoder 130 may decode a column address of the received address ADDR. The address decoder 130 may connect the input/output circuit 140 and the memory cell array 110 according to a decoded column address.

For example, the address decoder 130 may include components such as a row decoder, a column decoder, and an address buffer.

In an embodiment, the address decoder 130 may include a switch control signal generator 131 and a plurality of switching circuit groups $SW\_GR_1$ to SW_GRn.

The switch control signal generator 131 may generate a switch control signal controlling the plurality of switching circuit groups SW_GR1 to SW_GRn in response to a select signal SEL of the control logic 150.

In an embodiment, each of the plurality of switching circuit groups SW_GR1 to SW_GRn may include a plurality of switching circuits. The select signal SEL may include a signal for selecting a switching circuit to be turned on and a switching circuit to be turned off among the plurality of switching circuits included in the plurality of switching circuit groups SW_GR1 to SW_GRn.

Each of the plurality of switching circuit groups SW_GR1 to SW_GRn may be connected to any one word line group among the plurality of word line groups. In addition, the plurality of switching circuit groups SW_GR1 to SW_GRn may be connected to a plurality of voltage regulators 121-1 to **121-*n*, respectively. The plurality of switching circuit groups SW_GR1 to SW_GRn may connect or disconnect the connected word line group to or from the plurality of voltage regulators 121-1 to 121-*n***.

The input/output circuit 140 may include a plurality of page buffers. The plurality of page buffers may be connected to the memory cell array 110 through the bit lines BL1 to BLm. During the read operation or a verify operation, data stored in the selected memory cells may be sensed through the bit lines BL1 to BLm, and the sensed data may be stored in the page buffers.

The control logic 150 may control the voltage generator 120, the address decoder 130, and the input/output circuit 140. The control logic 150 may operate in response to a command CMD transferred from an external device. The control logic 150 may control the peripheral circuits by generating various signals in response to the command CMD and the address ADDR.

In an embodiment, the control logic 150 may include a read operation controller 151.

The read operation controller 151 may entirely control the read operation of the memory device 100. For example, the read operation controller 151 may generate the operation signal OPSIG instructing to generate the read voltage, the pass voltage, and the like, and provide the operation signal OPSIG to the voltage generator 120. In addition, the read operation controller 151 may generate the address ADDR indicating a position to which the operation voltage Vop is applied and transfer the address ADDR to the address decoder 130. In addition, the read operation controller 151 may generate the select signal SEL for selecting the switching circuits to be turned on or turned off and provide the select signal SEL to the switch control signal generator 131.

Figure 2:
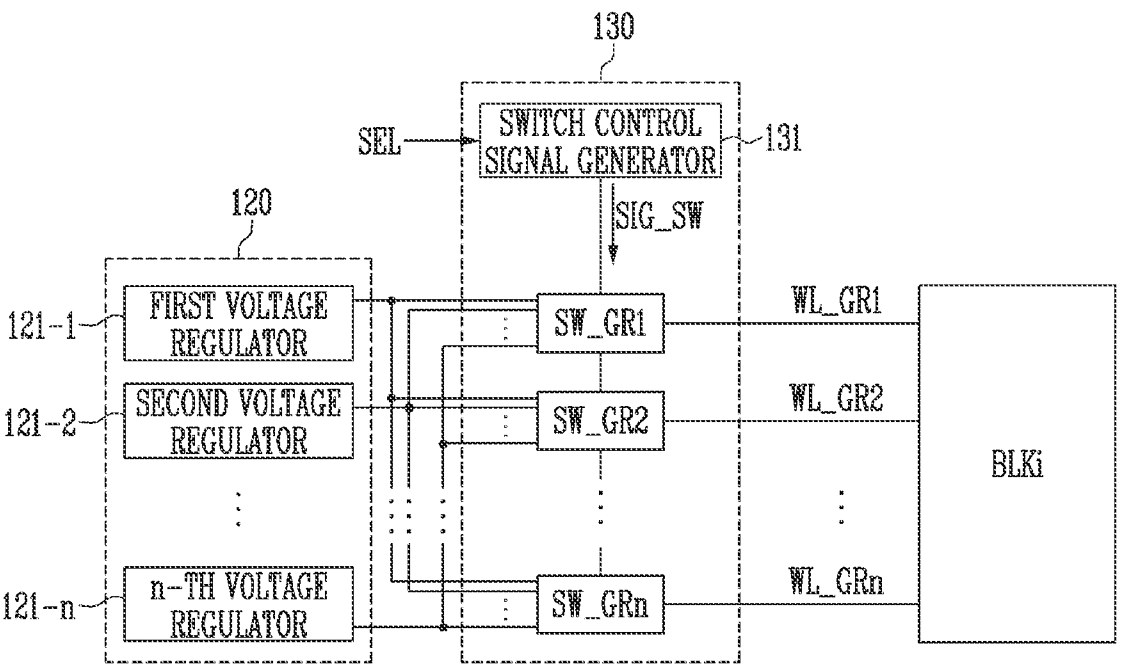
FIG. 2 is a diagram illustrating a connection relationship between a plurality of voltage regulators, a plurality of switching circuit groups, and a plurality of word line groups according to an embodiment of the present disclosure.

FIG. 2 is a diagram illustrating a connection relationship between a plurality of voltage regulators, a plurality of switching circuit groups, and a plurality of word line groups according to an embodiment of the present disclosure.

Referring to FIG. 2, a memory block BLKi may indicate any one memory block among the plurality of memory blocks BLK1 to BLKz of FIG. 1.

In an embodiment, the memory block BLKi may be connected to a plurality of word line groups WL_GR1 to WL_GRn.

Each of the plurality of switching circuit groups SW_GR1 to SW_GRn may be connected to any one among the plurality of word line groups WL_GR1 to WL_GRn. In addition, each of the plurality of switching circuit groups SW_GR1 to SW_GRn may be connected to the plurality of voltage regulators 121-1 to **121-*n***.

For example, the first switching circuit group SW_GR1 may be connected to the first word line group WL_GR1 and the plurality of voltage regulators 121-1 to **121-*n*. The first word line group WL_GR1 may receive the operation voltages from the plurality of voltage regulators 121-1 to 121-*n* through the first switching circuit group SW_GR1. The second switching circuit group SW_GR2 may be connected to the second word line group WL_GR2 and the plurality of voltage regulators 121-1 to 121-*n*. The second word line group WL_GR2 may receive the operation voltages from the plurality of voltage regulators 121-1 to 121-*n* through the second switching circuit group SW_GR2. In addition, the n-th switching circuit group SW_GRn may be connected to the n-th word line group WL_GRn and the plurality of voltage regulators 121-1 to 121-*n*. The n-th word line group WL_GRn may receive the operation voltages from the plurality of voltage regulators 121-1 to 121-*n*** through the n-th switching circuit group SW_GRn.

The switch control signal generator 131 may generate a switch control signal SIG_SW in response to the select signal SEL. The switch control signal SIG_SW may be a control signal controlling to connect or disconnect at least one voltage regulator among the plurality of voltage regulators 121-1 to **121-*n* to or from each word line group. The plurality of switching circuit groups SW_GR1 to SW_GRn may connect or disconnect the plurality of voltage regulators 121-1 to 121-*n* to or from the plurality of word line groups WL_GR1** to WL_GRn in response to the switch control signal SIG_SW.

Figure 3:
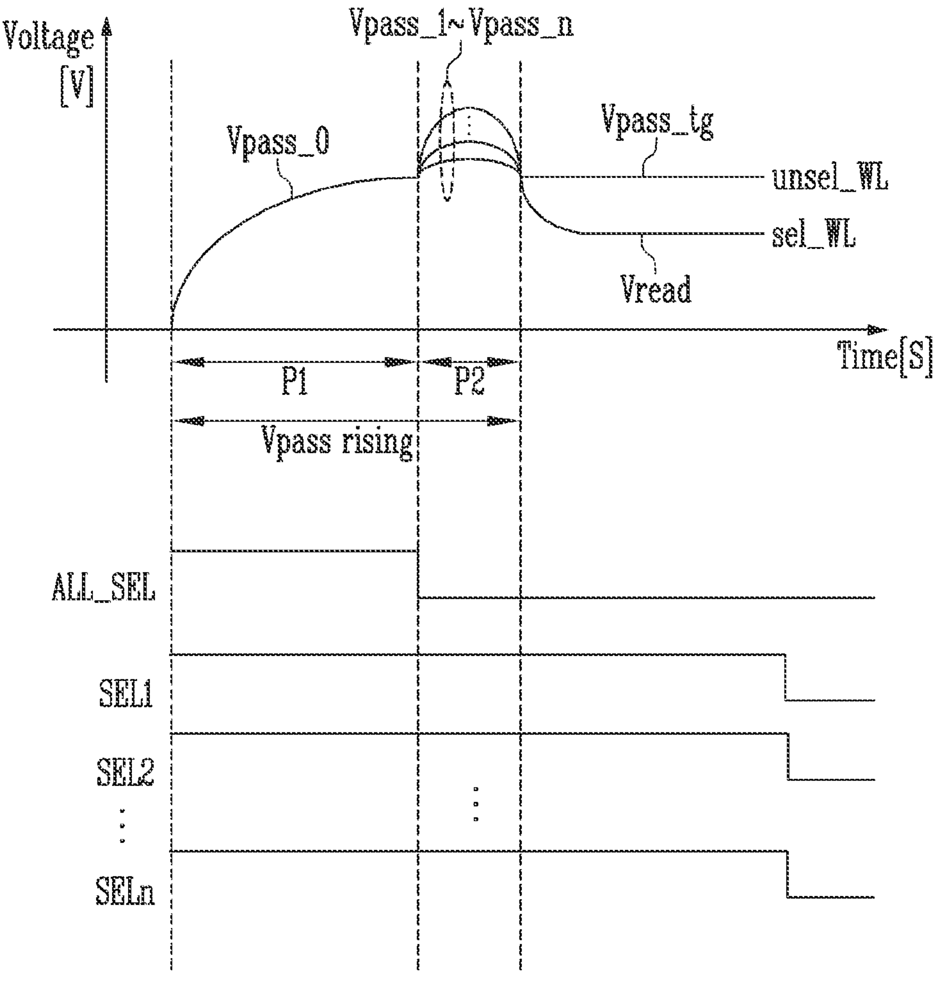
FIG. 3 is a diagram illustrating a read operation according to an embodiment of the present disclosure.

FIG. 3 is a diagram illustrating a read operation according to an embodiment of the present disclosure.

In FIG. 3, a graph of an upper end may indicate a level of a voltage applied to each word line according to a time. At this time, a horizontal axis of the graph may indicate the time, and a vertical axis may indicate a magnitude of the voltage.

The read operation may include a pass voltage rising period Vpass rising in which the pass voltage is applied to the plurality of word line groups.

In an embodiment, the pass voltage rising period Vpass rising may include a first pass voltage application period P1 in which the same 0-th pass voltage Vpass_0 is applied to all word line groups and a second pass voltage application period P2 in which different pass voltages Vpass_1 to Vpass_n are applied to each word line group. As used herein, the tilde "~" indicates a range of components. For example, "Vpass_1~Vpass_n" indicates the pass voltages Vpass_1, Vpass_2, . . . , and Vpass_n shown in FIG. 3.

In the first pass voltage application period P1, the plurality of word line groups may receive the 0-th pass voltage Vpass_0 from the plurality of voltage regulators through the switching circuit group connected to each word line group. An operation of the memory device in the first pass voltage application period P1 is described in detail with reference to FIGS. 5A and 5B to be described later.

In the second pass voltage application period P2, the plurality of word line groups may receive the different pass voltages Vpass_1 to Vpass_n from any one voltage regulator through the switching circuit group connected to each word line group. An operation of the memory device in the second pass voltage application period P2 is described in detail with reference to FIGS. 6A and 6B to be described later.

Thereafter, the read operation may include a period in which a read voltage Vread is applied to a selected word line sel_WL among the plurality of word lines included in the plurality of word line groups. In addition, while the read voltage Vread is applied to the selected word line sel_WL, a target pass voltage Vpass_tg may be applied to unselected word lines unsel_WL.

Signal values shown at a lower end of the graph may indicate the select signal input to the switch control signal generator 131.

In an embodiment, the select signal may include a plurality of select signals ALL_SEL and SEL1 to SELn.

The integration select signal ALL_SEL may be a signal for selecting all switching circuits included in the plurality of switching circuit groups. The integration select signal ALL_SEL may have a high level in the first pass voltage application period P1 and have a low level in the second pass voltage application period P2.

Each of the first to n-th select signals SEL1 to SELn may be a signal for selecting any one of the plurality of switching circuits included in the plurality of switching circuit groups. The first to n-th select signals SEL1 to SELn may have a high level in the first pass voltage application period P1 and the second pass voltage application period P2.

An operation of the switch control signal generator 131 according to the plurality of select signals ALL_SEL and SEL1 to SELn is described in detail with reference to FIG. 4 to be described later.

Figure 4:
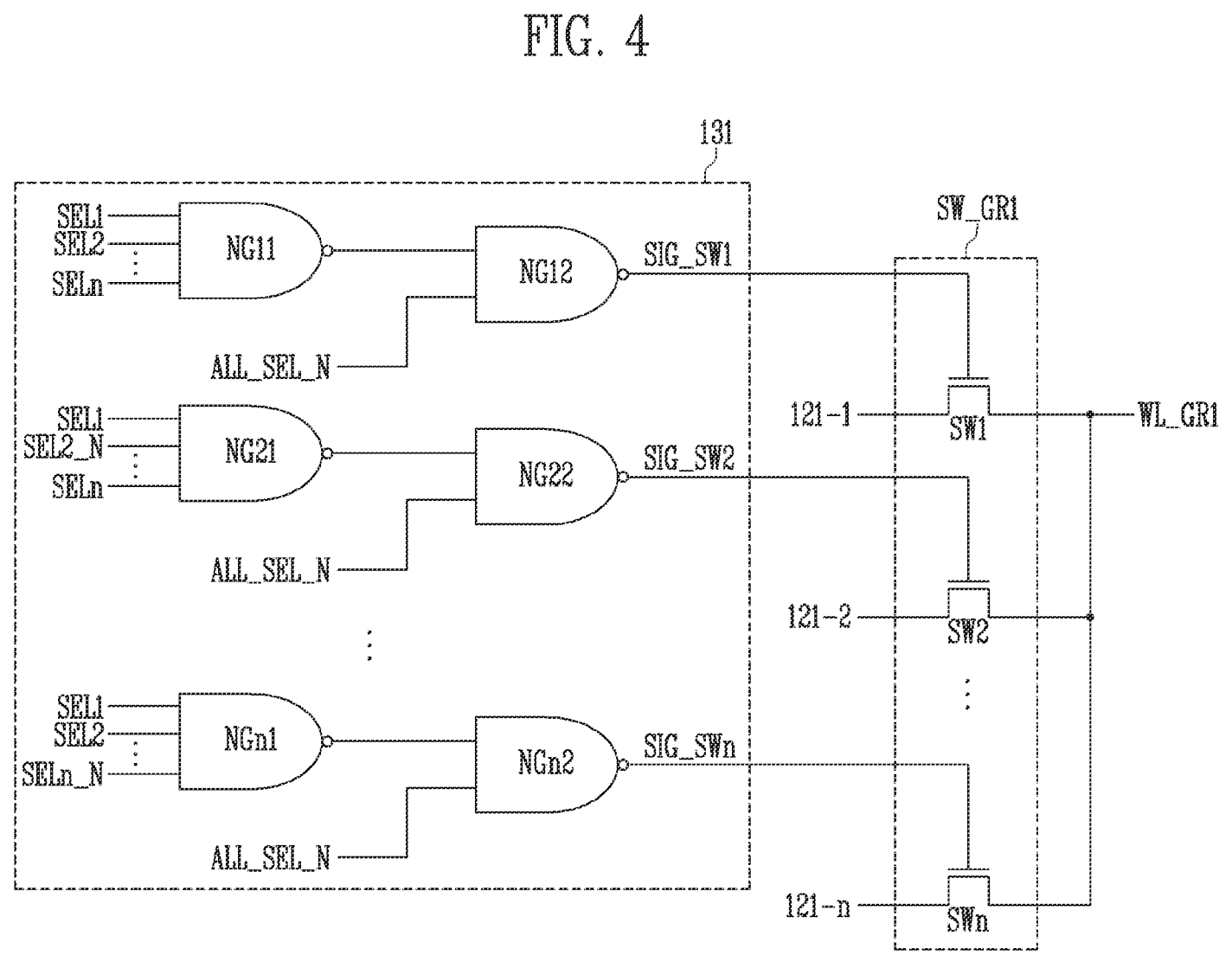

FIG. 4 is a diagram illustrating an operation of a switch control signal generator according to an embodiment of the present disclosure. The switch control signal generator 131 of FIG. 4 may indicate an example of the switch control signal generator 131 of FIG. 1. Hereinafter, an example in which the switch control signal generator 131 controls the first switching circuit group SW_GR1 is described with reference to FIG. 4, but the same method may be applied to the other switching circuit groups SW_GR2 to SW_GRn.

Specifically, FIG. 4 may illustrate a logic circuit diagram of the switch control signal generator 131.

Referring to FIG. 4, the switch control signal generator 131 may decode the select signal to generate the switch control signal controlling the first switching circuit group SW_GR1.

In an embodiment, the first switching circuit group SW_GR1 may include a plurality of switching circuits SW1 to SWn.

In an embodiment, the plurality of switching circuits SW1 to SWn may be configured as an NMOS type of high voltage switching circuit.

In an embodiment, the plurality of switching circuits SW1 to SWn may be connected to the first word line group WL_GR1. In addition, each of the plurality of switching circuits SW1 to SWn may be connected to any one voltage regulator among the plurality of voltage regulators 121-1 to **121-*n***.

In an embodiment, the plurality of switching circuits SW1 to SWn may connect or disconnect the plurality of voltage regulators 121-1 to **121-*n* to or from the first word line group WL_GR1 in response to a plurality of switch control signals SIG_SL1 to SIG_SLn output from the switch control signal generator 131**.

For example, the first switching circuit SW1 may connect or disconnect the first voltage regulator 121-1 to or from the first word line group WL_GR1 in response to the first switch control signal SIG_SW1. Specifically, when the first switch control signal SIG_SW1 has a high level, the first switching circuit SW1 may connect the first voltage regulator 121-1 to the first word line group WL_GR1. Conversely, when the first switch control signal SIG_SW1 has a low level, the first switching circuit SW1 may disconnect the first word line group WL_GR1 from the first voltage regulator 121-1. The remaining switching circuits SW2 to SWn may also operate in the same method as the first switching circuit SW1 described above.

In an embodiment, the switch control signal generator 131 may be configured of a two-stage NAND gate. For example, an eleventh NAND gate NG11 and a twelfth NAND gate NG12 may configure a two-stage NAND gate outputting the first switch control signal SIG_SW1 that controls the first switching circuit SW1. The eleventh NAND gate NG11 may receive the select signal and output an output signal. At this time, the select signal may include the plurality of select signals SEL1 to SELn. The twelfth NAND gate NG12 may receive the output signal of the eleventh NAND gate NG11 and an inversion value ALL_SEL_N of the integration select signal, and output the first switch control signal SIG_SW1. Remaining NAND gate circuits may operate in the same method as the eleventh NAND gate NG11 and twelfth NAND gate NG12 described above.

In the first pass voltage application period P1 of FIG. 3, since the integration select signal ALL_SEL has a high level, the plurality of switch control signals SIG_SW1 to SIG_SWn may have a high level. In this case, the plurality of switching circuits SW1 to SWn may be turned on.

Meanwhile, a select signal input to first-stage NAND gates NG11 and NG21 to NGn1 may vary according to the voltage regulator connected to the word line group. For example, in the second pass voltage application period P2, the first word line group WL_GR1 may receive the pass voltage from the first voltage regulator 121-1. In this case, the eleventh NAND gate NG11 may receive the plurality of select signals SEL1 to SELn, and the remaining first-stage NAND gates NG21 to NGn1 may receive an inversion signal SEL2_N to SELn_N of at least one select signal among the plurality of select signals SEL1 to SELn. Accordingly, the first switch control signal SIG_SW1 may have a high level, and the remaining switch control signals SIG_SW2 to SIG_SWn may have a low level. In this case, the first switching circuit SW1 may be turned on, and the remaining switching circuits SW2 to SWn may be turned off.

Figure 5A:
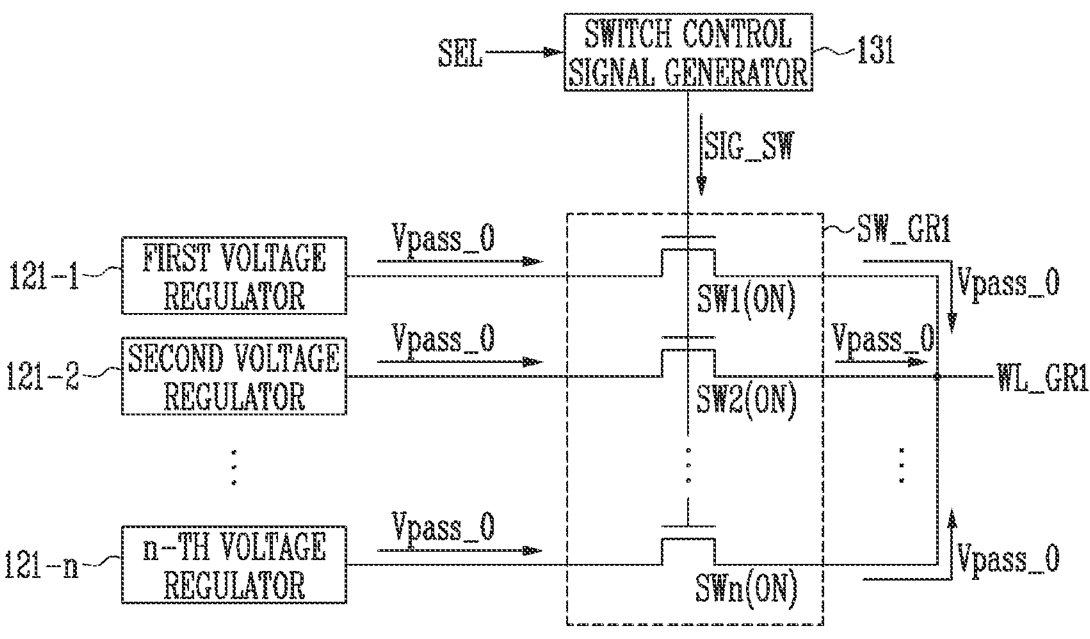
FIGS. 5A and 5B are diagrams illustrating an operation of a memory device in a first pass voltage application period according to an embodiment of the present disclosure.
Figure 5B:
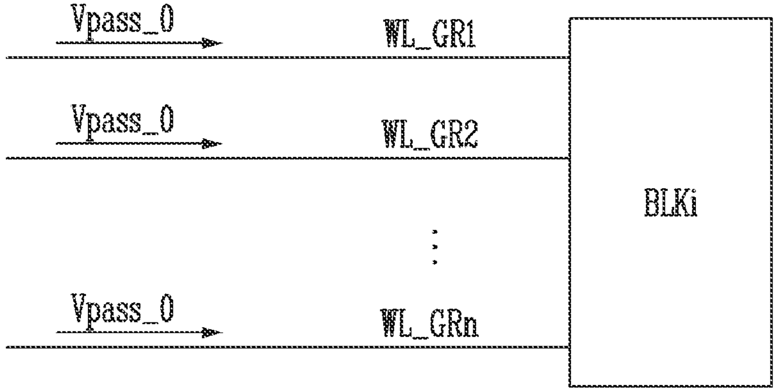

FIGS. 5A and 5B are diagrams illustrating an operation of a memory device in a first pass voltage application period according to an embodiment of the present disclosure.

Specifically, FIG. 5A is a circuit diagram illustrating an operation of the memory device 100 in the first pass voltage application period P1 of FIG. 3, and FIG. 5B is a circuit diagram applied to the pass voltage applied to the plurality of word line groups WL_GR1 to WL_GRn.

Referring to FIG. 5A, the plurality of voltage regulators 121-1 to **121-*n* may generate the same 0-th pass voltage Vpass_0**.

The switch control signal generator 131 may receive the select signal SEL and generate the switch control signal SIG_SW. The switch control signal SIG_SW may be a signal controlling the voltage regulators 121-1 to **121-*n*** to be connected to the first word line group WL_GR1.

The plurality of switching circuits SW1 to SWn may be turned on according to the switch control signal SIG_SW. The plurality of switching circuits SW1 to SWn may connect the plurality of voltage regulators 121-1 to **121-*n*** to the first word line group WL_GR1.

The first word line group WL_GR1 may receive the 0-th pass voltage Vpass_0 from the plurality of voltage regulators 121-1 to **121-*n*** through the plurality of switching circuits SW1 to SWn.

Meanwhile, in the above-described example, an example in which the first word line group WL_GR1 receives the pass voltage is described, but the other word line groups WL_GR2 to WL_GRn may also receive the pass voltage in the same method.

Referring to FIG. 5B, in the first pass voltage application period P1, the plurality of word line groups WL_GR1 to WL_GRn may receive the same 0-th pass voltage Vpass_0.

Figure 6A:
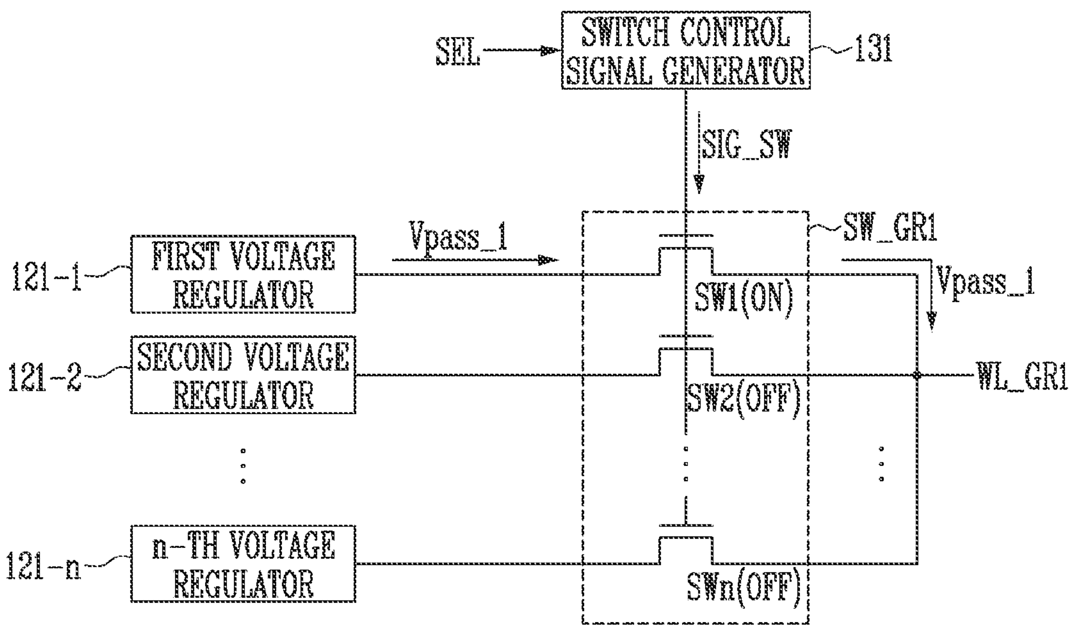
FIGS. 6A and 6B are diagrams illustrating an operation of a memory device in a second pass voltage application period according to an embodiment of the present disclosure.
Figure 6B:
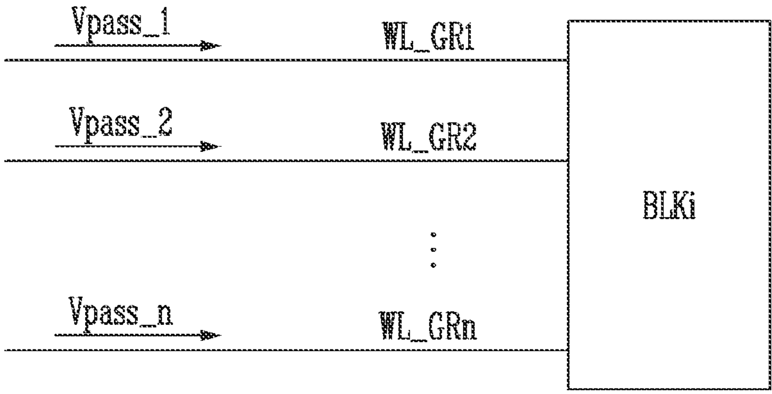

FIGS. 6A and 6B are diagrams illustrating an operation of a memory device in a second pass voltage application period according to an embodiment of the present disclosure.

Specifically, FIG. 6A is a circuit diagram illustrating the operation of the memory device 100 in the second pass voltage application period P2 of FIG. 3, and FIG. 6B is a diagram illustrating the pass voltage applied to the plurality of word line groups WL_GR1 to WL_GRn.

Referring to FIG. 6A, the plurality of voltage regulators 121-1 to **121-*n* may generate different pass voltages. For example, the first voltage regulator 121-1 may generate the first pass voltage Vpass_1. The remaining voltage regulators 121-2 to 121-*n* may generate the different pass voltages Vpass_2** to Vpass_n.

The switch control signal generator 131 may receive the select signal SEL and generate the switch control signal SIG_SW. The switch control signal SIG_SW may be a control signal controlling to connect the first voltage regulator 121-1 to the first word line group WL_GR1 and disconnecting the remaining voltage regulators 121-2 to **121-*n***.

The first switching circuit SW1 may be turned on and the remaining switching circuits SW2 to SWn may be turned off according to the switch control signal SIG_SW. The first switching circuit SW1 may connect the first voltage regulator 121-1 to the first word line group WL_GR1 according to the switch control signal SIG_SW. The first word line group WL_GR1 may receive the first pass voltage Vpass_1 from the first voltage regulator 121-1 through the first switching circuit SW1.

Meanwhile, in the above-described example, an example in which the first word line group WL_GR1 receives the pass voltage is described, but the other word line groups WL_GR2 to WL_GRn may also receive the pass voltage in the same method.

For example, the second word line group WL_GR2 may receive the second pass voltage Vpass_2 generated from the second voltage regulator 121-2. The n-th word line group WL_GRn may receive the n-th pass voltage Vpass_n generated from the n-th voltage regulator **121-*n***.

Referring to FIG. 6B, in the second pass voltage application period P2, the plurality of word line groups WL_GR1 to WL_GRn may receive the different pass voltages Vpass_1 to Vpass_n.

Figure 7:
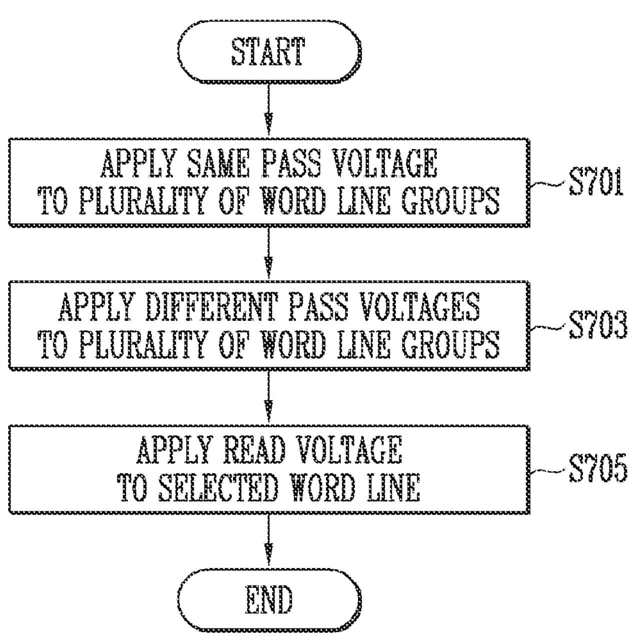
FIG. 7 is a flowchart illustrating a method of operating a memory device according to an embodiment of the present disclosure.

FIG. 7 is a flowchart illustrating a method of operating a memory device according to an embodiment of the present disclosure.

The method shown in FIG. 7 may be performed by, for example, the memory device 100 shown in FIG. 1.

Referring to FIG. 7, in step S701, the memory device 100 may apply the same pass voltage to the plurality of word line groups.

For example, the memory device 100 may connect the plurality of voltage regulators to the plurality of word line groups through the plurality of switching circuits. Accordingly, the plurality of word line groups may receive the same pass voltage.

In step S703, the memory device 100 may apply the different pass voltages to the plurality of word line groups.

For example, the memory device 100 may connect the plurality of voltage regulators to different word line groups through the plurality of switching circuits. At this time, the plurality of voltage regulators may generate the different pass voltages, and each word line group may receive the pass voltages generated from the connected voltage regulator.

In step S705, the memory device 100 may apply the read voltage to the selected word line. In addition, the memory device 100 may apply the pass voltages to the unselected word line.

What is claimed is:

1. A memory device comprising:

a plurality of voltage regulators configured to generate operation voltages applied to a word line group;

a switch control signal generator configured to generate at least one switch control signal controlling to connect or disconnect at least one voltage regulator among the plurality of voltage regulators to or from the word line group; and a plurality of switching circuits each connected to any one voltage regulator among the plurality of voltage regulators, and connecting the plurality of voltage regulators to the word line group according to the switch control signal in a period in which a pass voltage among the operation voltages is applied to the word line group during a read operation, wherein the plurality of voltage regulators each generate a first pass voltage, wherein the word line group receives the first pass voltages from each of the plurality of voltage regulators, respectively, through the plurality of switching circuits, wherein the switch control signal generator generates the switch control signals to connect a first voltage regulator among the plurality of voltage regulators to the word line group and to disconnect remaining voltage regulators, after the first pass voltage is applied to the word line group, in the period in which the pass voltage is applied, and wherein the first voltage regulator is connected to a first switching circuit among the plurality of switching circuits and generates a second pass voltage after the first pass voltage is applied to the word line group.

2. The memory device of claim 1, wherein the first switching circuit connects the first voltage regulator to the word line group so that the second pass voltage is applied to the word line group according to the switch control signal.

3. The memory device of claim 1, wherein the period in which the pass voltage is applied is performed before a read voltage among the operation voltages is applied to a selected word line.

4. A memory device comprising:

a first voltage regulator configured to generate operation voltages applied to a first word line group;

a second voltage regulator configured to generate the operation voltages applied to a second word line group;

a first switching circuit group connected to the first word line group, the first voltage regulator, and the second voltage regulator;

a second switching circuit group connected to the second word line group, the first voltage regulator, and the second voltage regulator; and a switch control signal generator configured to generate a switch control signal controlling the first switching circuit group and the second switching circuit group to apply a first pass voltage generated by the first voltage regulator and the second voltage regulator to the first word line group and the second word line group, in a period in which a pass voltage among the operation voltages is applied to the first word line group and the second word line group, wherein the first switching circuit group comprises:

a first switching circuit configured to connect or disconnect the first voltage regulator to or from the first word line group; and a second switching circuit configured to connect or disconnect the second voltage regulator to or from the first word line group, and wherein the second switching circuit group comprises:

a third switching circuit configured to connect or disconnect the first voltage regulator to or from the second word line group; and a fourth switching circuit configured to connect or disconnect the second voltage regulator to or from the second word line group.

5. The memory device of claim 4, wherein the first switching circuit and the second switching circuit connect the first voltage regulator and the second voltage regulator to the first word line group according to the switch control signal, and wherein the third switching circuit and the fourth switching circuit connect the first voltage regulator and the second voltage regulator to the second word line group according to the switch control signal.

6. The memory device of claim 5, wherein the first word line group receives the first pass voltage from the first voltage regulator and the second voltage regulator through the first switching circuit and the second switching circuit, and wherein the second word line group receives the first pass voltage from the first voltage regulator and the second voltage regulator through the third switching circuit and the fourth switching circuit.

7. The memory device of claim 4, wherein the switch control signal generator generates the switch control signal controlling the first switching circuit group and the second switching circuit group to apply a second pass voltage to the first word line group and apply a third pass voltage different from the second pass voltage to the second word line group, after the first pass voltage is applied to the first word line group and the second word line group, in the period in which the pass voltage is applied.

8. The memory device of claim 7, wherein the first voltage regulator generates the second pass voltage after the first pass voltage is applied to the first word line group and the second word line group.

9. The memory device of claim 8, wherein the first switching circuit connects the first voltage regulator to the first word line group according to the switch control signal, and wherein the second switching circuit disconnects the first word line group and the second voltage regulator from each other according to the switch control signal.

10. The memory device of claim 7, wherein the second voltage regulator generates a third pass voltage after the first pass voltage is applied to the first word line group and the second word line group.

11. The memory device of claim 10, wherein the third switching circuit disconnects the second word line group and the first voltage regulator from each other according to the switch control signal, and wherein the fourth switching circuit connects the second voltage regulator to the second word line group according to the switch control signal.

* * * * *